United States Patent [19]
Seifert et al.

[11] Patent Number: 5,644,238
[45] Date of Patent: Jul. 1, 1997

[54] METHOD AND APPARATUS FOR COMPARING LOAD CURRENT IN AN ELECTRICAL CIRCUIT WITH THE CAPACITY OF ITS SUPPLY SOURCE

[76] Inventors: Gregory J. Seifert, 1433 Raymond Ave., St. Paul, Minn. 55108; Peter G. Seifert, 1685 Wellesley Ave., St. Paul, Minn. 55105

[21] Appl. No.: 472,437

[22] Filed: Jun. 7, 1995

[51] Int. Cl.⁶ .................... G01R 31/02; G01R 31/327
[52] U.S. Cl. .................... 324/424; 324/132; 324/140 R
[58] Field of Search .................... 324/424, 132, 324/133, 140 R, 158.1, 76.11; 361/93, 104; 364/483, 550, 551.01

[56] References Cited

U.S. PATENT DOCUMENTS

| | | |
|---|---|---|
| 4,035,809 | 7/1977 | Jacobsen . |
| 4,368,519 | 1/1983 | Kennedy . |
| 4,426,651 | 1/1984 | Muellner et al. . |
| 4,559,496 | 12/1985 | Harnder, Jr. et al. . |
| 4,581,705 | 4/1986 | Gilker et al. . |
| 4,620,150 | 10/1986 | Germer et al. . |
| 4,631,625 | 12/1986 | Alexander et al. . |
| 4,654,588 | 3/1987 | Munday . |
| 5,144,226 | 9/1992 | Rapp .................... 324/133 |
| 5,164,660 | 11/1992 | Carl, Jr. . |
| 5,245,496 | 9/1993 | Kim et al. . |

*Primary Examiner*—Walter E. Snow
*Attorney, Agent, or Firm*—Patterson & Keough, P.A.

[57] ABSTRACT

A method and apparatus for measuring and recording peak RMS electrical current over multiple moving-average time periods provides current-flow information in the same units used to characterize electrical system distribution components—primarily overcurrent protective devices such as fuses and circuit breakers. Rather than reporting current-flow information based on a series of brief observations of a few line cycles or seconds, short duration RMS current-flow information in multiple geometrically increasing time intervals is calculated and accumulated to form longer duration RMS values of current. The resulting set of peak RMS current-flow values properly characterizes both the long and short term heating effects of the electrical current in the circuit under inspection, and is used in direct side-by-side comparisons with manufacturer provided data for specific distribution components in the evaluation of usage versus capacity and other functions relevant to distribution system design.

19 Claims, 5 Drawing Sheets

$$I_M(T) = \max_t \sqrt{\dfrac{\int_{t-T}^{t} i^2(t)\, dt}{T}}$$

Figure 1A $$I_M(T) = \max_t \sqrt{\frac{\sum_{K=0}^{(T/T_{MIN})-1}\left[\frac{\int_{(t-(K\times T_{MIN})-T_{MIN})}^{(t-(K\times T_{MIN}))} i^2(t)\,dt}{T_{MIN}}\right]}{T/T_{MIN}}}$$

where T is an integer multiple of $T_{MIN}$

← 11

Figure 1B $$I_{RMS}(T) = \sqrt{\frac{\int_{t-T}^{t} i^2(t)\,dt}{T}} = \frac{\int_{t-T}^{t} i^2(t)\,dt}{I_{RMS}(T)\times T} \cong \frac{\int_{t-T}^{t} i^2(t)/I_{RMS}(T)\,dt}{T}$$

METHOD AND APPARATUS FOR COMPARING LOAD CURRENT IN AN ELECTRICAL CIRCUIT WITH THE CAPACITY OF ITS SUPPLY SOURCE

BACKGROUND OF THE INVENTION

1. Field of the Invention

This invention relates to measuring and recording the current drawn by an electrical load, and more particularly, to using the measured and recorded data for direct evaluation of the current usage versus capacity function for given loads and circuit elements in order to analyze the capabilities of current-limiting devices within such circuits.

2. Description of Related Art

Installations of electrical equipment in residential, commercial, and industrial settings include fuses or circuit breakers as protective current-interrupting safety devices. These devices function to protect both the equipment and the circuit elements against overcurrent conditions, and are nominally rated in amperes. The numerical ampere rating of a fuse or circuit breaker is the normal current it will carry for an indefinite time period without opening the circuit. Although this nominal designation properly identifies the circuit size, it somewhat oversimplifies the actual current-carrying characteristics of the circuit.

Fuses and circuit breakers operate on a time-current curve and will melt or trip, respectively, on the basis of both magnitude and duration of current flow. When subjected to currents above their ampere rating they will open the circuit after a predetermined amount of time, the time being inversely related to the current—the greater the current, the shorter the time. A fuse can carry its rated current indefinitely without melting. But the same fuse might carry an additional twenty percent of its rated current for several minutes before melting. It may also carry twice its rated current for a few seconds, and it may sustain a yet higher multiple, perhaps ten times its rated current for only a fraction of a second. The "average melt curve" of a fuse is a graph that plots this current magnitude versus time-interval characteristic.

Manufacturers design fuses to have particular average melt curve shapes depending on the intended application, and they publish these curves for their users. An example of the application of a specialty fuse is the type used to protect a motor circuit, which must allow for a large motor-starting current. In this case a dual-element fuse is available that will carry on the order of ten times its rated current for a fraction of a second without melting. Similar considerations apply to circuit breakers. The manufacturers of circuit breakers publish "trip curves" that describe the time-current characteristics of their products.

In an effort to anticipate or analyze overload conditions, electricians and engineers measure current flow in distribution components and relate it to the capacity of the associated circuit. By definition, current-limiting safety devices represent the most current-inhibiting elements in an electrical distribution system, and current-flow information used in direct comparison to the current-allowance characteristics of these devices effectively quantifies the function of usage versus capacity for the entire circuit under inspection. Many devices are presently available to measure current flow in electrical distribution systems; these include handheld ammeters, chart recorders, and other power monitoring products. Some of these devices provide both continuous display of a short-term current measurement as well as retention of the maximum value observed during a survey period.

The desirable characteristics of fuse and circuit breaker operation stem from the fact that these and similar devices operate on the fundamentals of heating theory, and heat transfer calculations involve time averaging as well as magnitude information. The measure of the heating effect of an alternating current is its RMS (root-mean-square) value. By definition this is the value of any periodic current equal to the value of the direct current which, flowing through a resistance, produces the same heating effect in the resistance as the periodic current does. It is the evaluation of the RMS function on a given current waveform that determines its heating effect on current-limiting safety devices.

Devices that measure the RMS value of current for the purpose of electrical distribution system analysis are readily available. These devices evaluate the mean in the root-mean-square (RMS) function over a predetermined, fixed-time interval, and present the result in real time to the user. More advanced chart recording and storage versions of these devices plot or save the data as they are being generated, typically in an effort to locate the peak value of RMS current during a survey period. In the case of the latter, more advanced device, the output is the peak of the root-mean-square calculation carried out continuously over a defined mean interval—say one-eighth of a second. In other words, the device shows the maximum amount of current-flow for any one-eighth second during the circuit survey period.

What all of these existing tools fail to produce is maximum current-flow information in a unit form that can be used in direct comparison with the manufacturer published "average melt" characteristics of standard current interruption devices (typically fuses and circuit breakers). Average melt curves plot peak-current magnitude versus time-interval of application, and represent a significantly more complex interpretation of the current versus time information than can be obtained from existing measurement tools. In relation to the average melt fuse curve, a measurement of instaneous direct current using an ammeter, for example, or a peak value using an RMS type of measurement represents but a single point of relevant data. In some cases this single point is sufficient to estimate the entire load current curve, given that the load conforms to assumed boundaries of normality. Unfortunately, for varying reasons, this type of estimation is quite disadvantageous because it can significantly misrepresent the actual peak-current magnitude versus time-interval characteristics of a circuit.

SUMMARY OF THE INVENTION

To overcome the above and other disadvantages, an apparatus and method according to the invention provides the ability to measure peak RMS current values over a varying range of averaging periods. According to the invention, RMS current is monitored for some survey period, and a curve of peak-current magnitude versus time-intervals is produced, suitable for direct comparison to such curves for circuit interrupting devices. In other words, a method and apparatus according to the present invention collect, process, and store current-usage information in real time and subsequently present these data to the user in the peak magnitude versus time-interval form suitable for direct evaluation of the usage versus capacity function.

A typical survey period spans one or more days, depending on the load conditions. When a feeder or service supports a diversity of loads operating at indeterminate times, the survey period is lengthened to increase the probability of observing all or most combinations of short-duration and long-duration loading. Within the survey period, a plurality of heating intervals is defined over which RMS current is to be observed and maximum values retained. Because heating effects follow exponential equations, the lengths of these intervals are efficiently defined in a geometric progression.

As an example, the resulting data record contains not only the maximum value of RMS current drawn for one eighth of a second, but also the maximum value of RMS current drawn for any quarter second during the survey period, and the maximum value of RMS current drawn for any half second during the survey period, and so on. A sufficient number of mean-interval periods are recorded and maintained to properly characterize the monitored system in relation to the applicable current sensitive distribution component. The resulting data points allow the user to accurately evaluate the usage versus capacity and other relevant functions necessary in most design decision-making processes.

BRIEF DESCRIPTION OF THE DRAWINGS

FIGS. 1A, 1B and 1C show mathematical equations underlying an embodiment of the invention;

DETAILED DESCRIPTION OF PREFERRED EMBODIMENTS

Figure 1A:
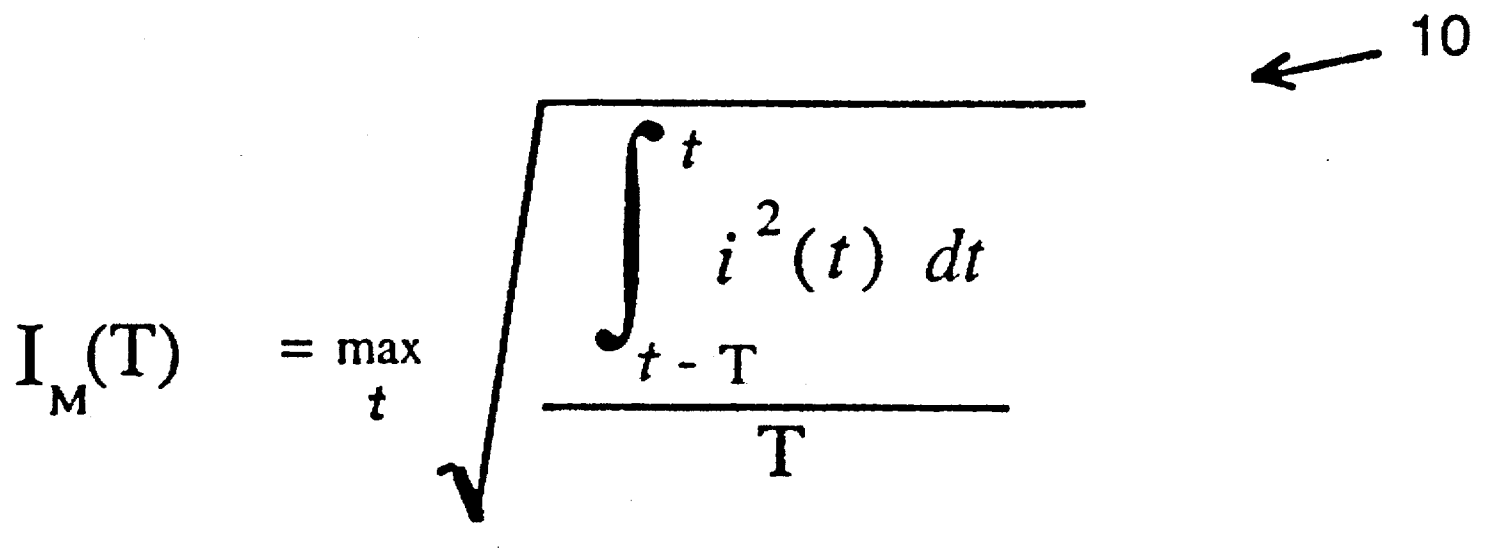

Mathematically, the desired quantity of peak-current magnitude ($I_M$) versus time-interval (T) of application is denoted by equation 10 of FIG. 1A, where $I_M$ is a function of T. This function is read as the maximum value over all time t (entire survey period) of the square root of the average value of the squared value of current, that is, the root of the mean of the square, where the average value is computed over the time interval T. As is known in the art, the integral of a function over a period, divided by the period length, equals the average value of the function over that period. The maximization in this function 10 implies its evaluation over every possible interval T in the survey period t. This function is equivalently represented (subject to constraints) by equation 11 of FIG. 1B where the mean evaluation of the square of the current has been broken into two parts, and is effectively evaluated by computing longer term means by averaging short term means. This mean separation, and the resulting process of constructing long term averages, more readily lends itself to a multi-processed system realization.

The physical realization of a system capable of evaluating this function according to an embodiment of the invention is greatly simplified by allowing several mathematical approximations, and choosing suitably limited input domains. Input domains are limited according to a preferred embodiment so as to provide output data in the range of the manufacturer provided average melt curves for standard current interruption devices. Of the duration intervals T, the minimum duration interval ($T_{MIN}$) is preferably fixed at ⅛ second, and the maximum is set at 4096 seconds according to a preferred embodiment. Of course, a wide variety of minimum and maximum duration intervals are contemplated according to embodiments of the invention.

Within the preferred range, the function is evaluated over sixteen geometrically progressively larger intervals increasing from the minimum to the maximum interval by doubling: ⅛ second, ¼ second, ½ second, and so on, for example. The resulting data set is suitable for direct visual comparison to published data for standard current interruption devices. Thus, the several mathematical approximations are as follows, according to a preferred embodiment. First, the maximization process is not carried out over all possible intervals (T) in the survey period (t), but rather the process is restricted to all intervals (T) beginning at discrete time separations ($T_{MIN}$) in t. Second, an approximation for the short term mean is made by squaring the output of the RMS approximation defined by equation 12 of FIG. 1C. Further approximations arise from the inherent quantization error associated with digital sampling systems and rounding error intrinsic to digital arithmetic.

Figure 2:
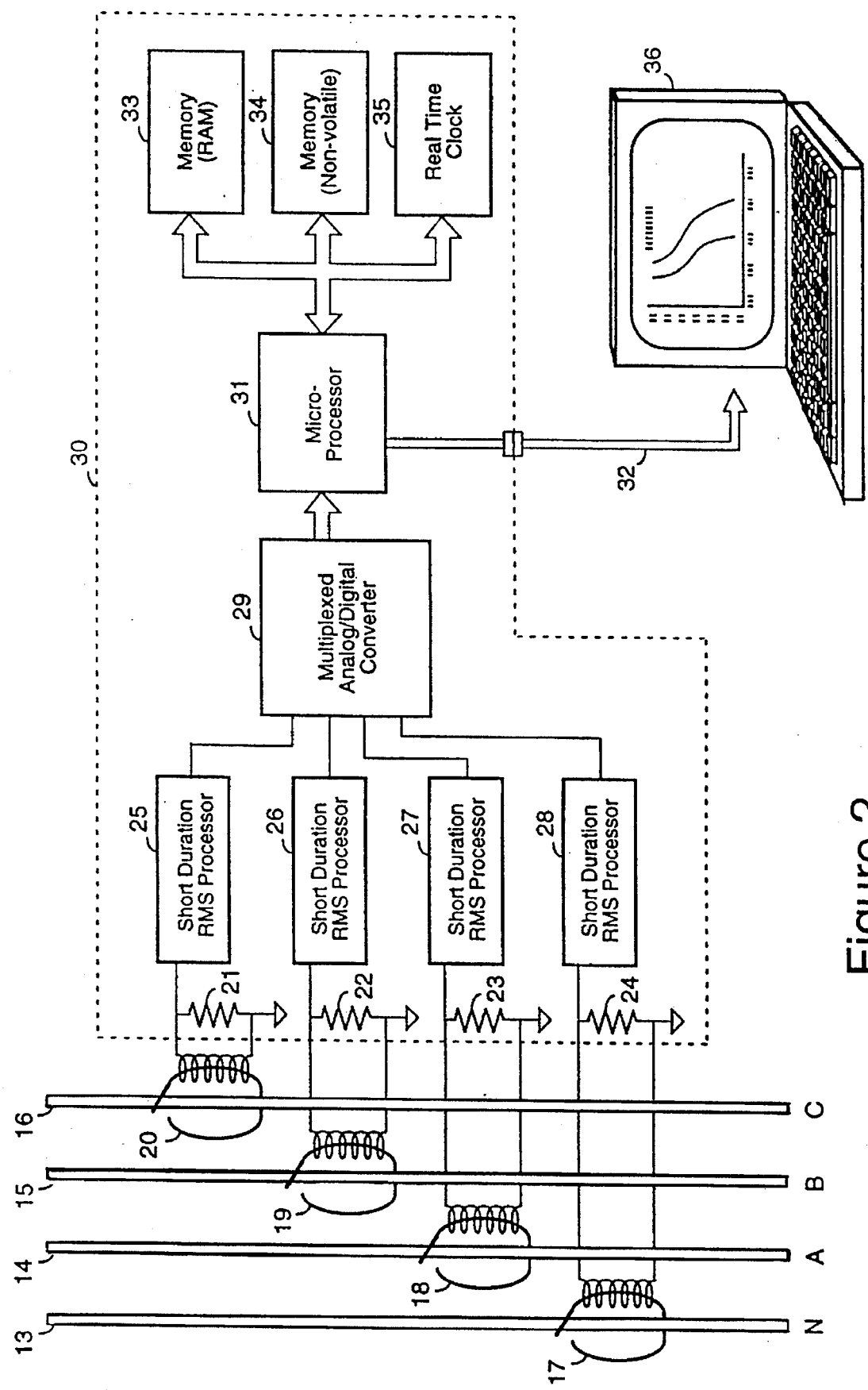
FIG. 2 is a block diagram showing an embodiment of the present invention with a set of input and output devices.

Turning to FIG. 2, according to a preferred embodiment, precision current transformer type current probes 17–20 (Fluke model 80i-600A, for example) are coupled with shunt resistors 21–24 to provide voltages to the processing circuitry that are scalar multiples of the current flowing in the conductors 13–16 under inspection. Probes 17–20 preferably are clamp-on type probes for unobtrusive connection to the system under inspection. Combined analog and digital signal processors preferably carry out the evaluation of the function denoted by equation 11, but of course other analog and digital signal processing arrangements also are contemplated according to the invention.

Analog signal processing devices 25–28 (Analog Devices model AD637, for example) are employed to continuously compute the RMS value of the input signals i(t), over the short-term averaging period $T_{MIN}$. Of course, other types of signal processing devices also are contemplated according to the invention. The monolithic wideband AD637, for example, can be used to embody an implicit solution of the RMS equation that overcomes the inherent limitations of straightforward RMS computation, particularly the limitations imposed in realizing exponential functions in analog elements. The actual computation performed by the AD637 or similar device preferably follows the estimation of equation 12 in FIG. 1C, which, given typical input current waveforms, provides an accurate solution. The resulting continuous value of short-term RMS current is sampled synchronously at the $T_{MIN}$ rate (⅛ second) and the remaining computational functions are carried out using 32-bit arithmetic, According to a preferred embodiment, a Philips Semiconductors 80C552 microprocessor 31, for example, is used, with its integral multiplexed ten-bit analog to digital converter 29, as the main real-time digital processing unit. Processor peripherals include 512 K bytes of random access memory 33 (Integrated Device Technology model IDT71256L, for example), 8 K bytes of nonvolatile memory 34 (Xicor model X88C64, for example), RS-232 communication drivers (Maxim model MAX233, for example), a real-time clock 35 (Intersil model ICM7170, for example), and a custom power supply. Although specific hardware has been described to accomplish the goals of the invention, the invention of course is not limited to this specifically described hardware.

There are four independent recording channels, according to a preferred embodiment. The channels preferably operate identically, and they are implemented with common software routines. Associated with each channel are a series of values generated by synchronously sampling the output of the short-duration RMS processor 25–28, at the periodic rate $T_{MIN}$, for example ⅛ second. According to a preferred embodiment, these samples are digitized and stored as ten-bit quantities in a circular first-in-first-out (FIFO) buffer implemented in random access memory 33. A pointer tracks the most recent entry in the buffer, which is the RMS value of electrical current over the most recent value of $T_{MIN}$. The samples stored in the buffer are considered in varying length sets, and are used to calculate the fifteen (for example) longer duration RMS values. In each such set, a second pointer into the FIFO is maintained which tracks the position of the oldest value in the interval. According to a preferred embodiment, two successive sample values comprise the most recent ¼ second, four values the most recent ½ second, and so on. The longest interval of 4096 seconds contains 32768 sampled values.

For each of the sixteen intervals, a 32-bit register preferably is maintained which holds the running sum of the squares of the RMS current samples for the most recent interval of that length. These registers preferably are kept in nonvolatile memory 34. In the same memory space, a preferred embodiment of the invention maintains sixteen maximum value registers, and the values of these registers, at the end of the survey period t, preferably comprise the output of the device.

Figure 3:
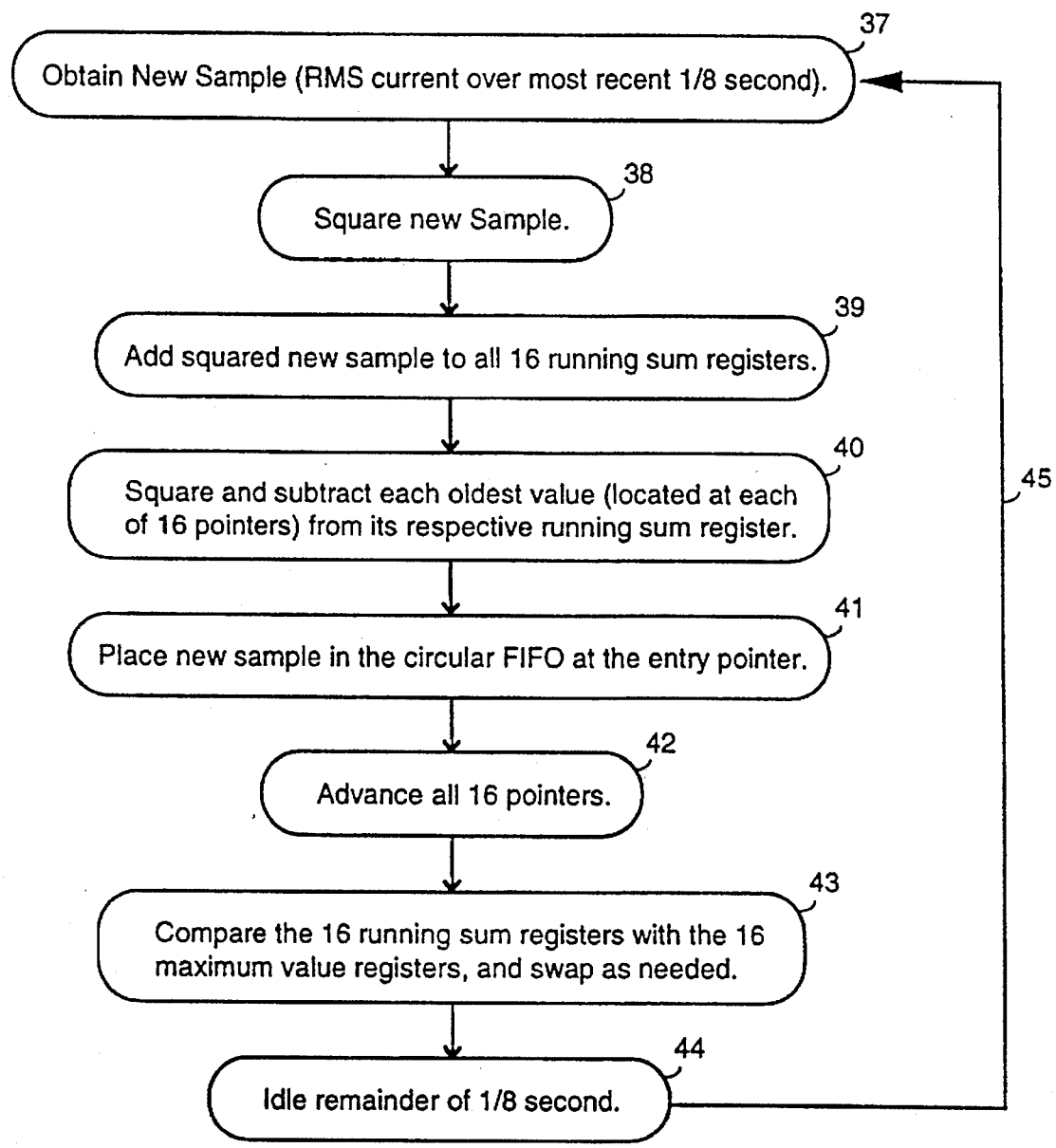
FIG. 3 is a flow chart according to an embodiment of the present invention showing a process that is executed for each short term interval.

FIG. 3 is a flow chart of operations 37–45 performed at each sample time for each of the four recording channels. At step 37, a new sample is obtained, for example the RMS current over the most recent ⅛ second. The new sample is squared at step 38, and the squared new sample is added to all 16 running sum registers in step 39. Each oldest value (located at each of the 16 pointers) is squared at step 40 and subtracted from its respective running sum register, and at step 41 each new sample is placed in the circular FIFO at the entry pointer. All 16 pointers are advanced at step 42. At step 43, the 16 running sum registers are compared with the 16 maximum value registers, and swapping occurs as needed. Idling occurs for the remainder of the ⅛ second time interval, and the process then repeats, as indicated at 45. Two final calculations performed after the survey period include dividing each of the maximum value registers by the number of samples in its interval to yield the mean of the squares, and calculating the square root to yield the root of the mean of the squares. The resulting sixteen values for each recorded channel preferably are transferred serially by serial link 32 to a suitable computing platform, such as a portable PC, and plotted on display 36 using existing data analysis software packages, such as Excel®, available from Microsoft Corp., for example.

Figure 4:
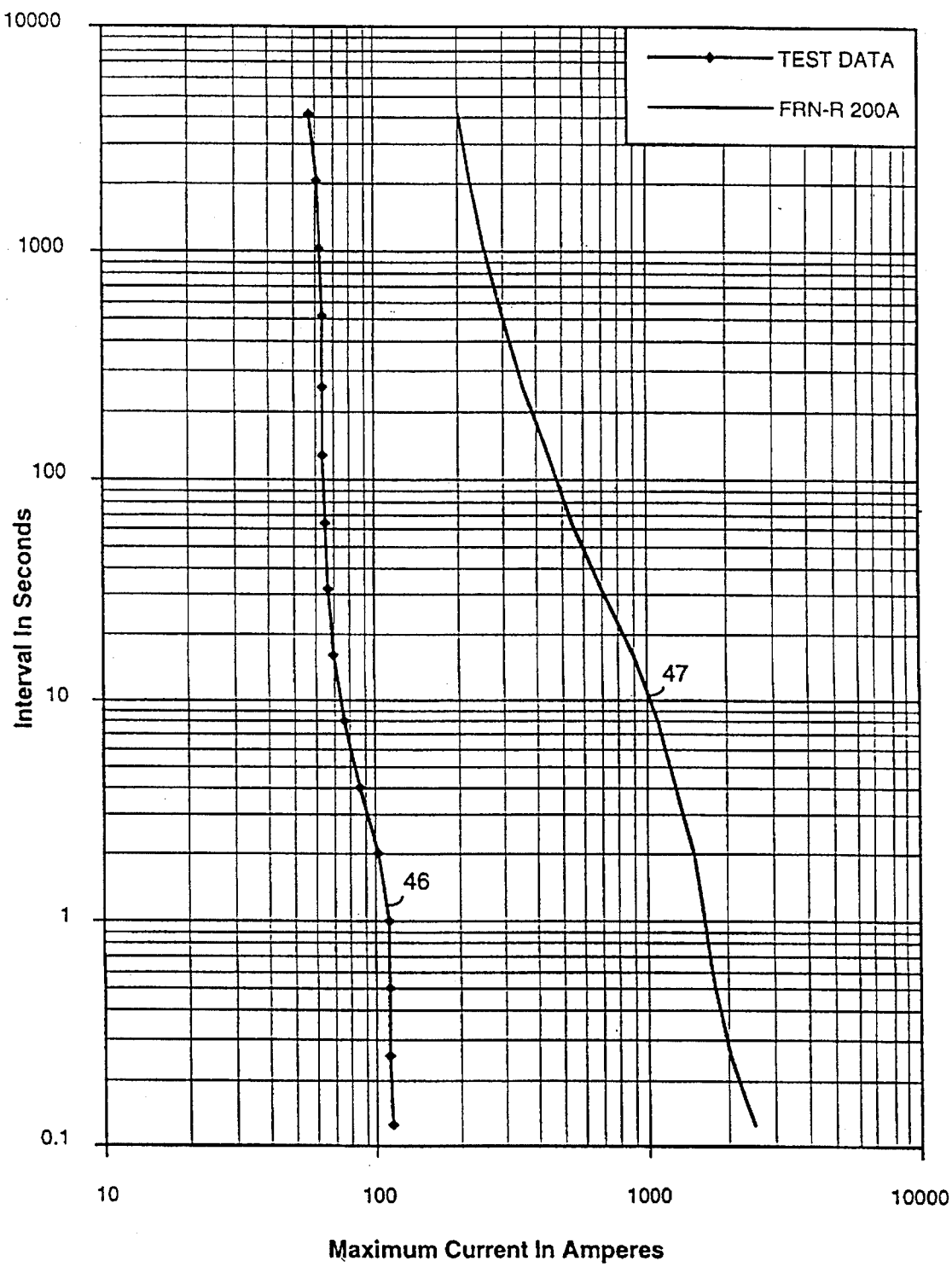
FIG. 4 is a graph showing two curves according to an embodiment of the invention, the first being the maximum current drawn by a typical electrical load, and the second being a typical "average melt" curve.

A preferred embodiment of the present invention monitors four current-carrying conductors simultaneously, a configuration appropriate for measuring a three phase feeder circuit with its neutral conductor. FIG. 4 is a graph that shows the sixteen maximum RMS current values as a load current plotted curve 46 for one phase of a typical circuit under inspection and the manufacturer published "average melt" curve 47 for a current-interrupting safety device, such as a dual element fuse (Bussman model FRN-R 200, for example), plotted on a traditional log-log scale. The knee in circuit curve 46 approximately located at the five second interval duration mark shows the effects of motor startup currents, according to this particular example. Values of load current 46 to the left and below curve 47 can be supplied without activating the current-interrupting safety device, for example without melting the fuse; conversely, values of load current curve 46 that lie above and to the right of curve 47 will cause the fuse to melt. In comparing these two curves 46–47 it can be observed that all of the recorded peak load currents 46 lie to the left and below curve 47 and therefore the fuse according to this example will not melt under the recorded peak load conditions. Further deductions can be supported from the graph, including the conclusion that additional short-duration loads of significant magnitude will not cause the fuse to melt.

Attention is directed to the Appendix, entitled Time-Current Load Characterization in Power Distribution Systems, which describes more specific examples according to the invention and which is incorporated herein by reference in its entirety.

While the invention has been described with reference to specific embodiments, the description is illustrative and is not to be construed as limiting the scope of the invention. Various other modifications and changes may occur to those skilled in the art without departing from the spirit and scope of the invention.

We claim:

1. A method of analyzing load currents in an electrical distribution system to anticipate potential overcurrent conditions for a current-limiting device in the system, the method comprising the steps of:
   (a) simultaneously monitoring an RMS current value of a load current in the system over a plurality of time intervals, at least two of the time intervals being of different lengths;
   (b) determining a peak-magnitude RMS current value for each time interval; and
   (c) developing a system current profile using the peak-magnitude RMS current value for each time interval, the system current profile showing multiple, actual values of RMS current over the plurality of time intervals, the system current profile being comparative to a curve reflective of the potential overcurrent conditions for the current-limiting device in the system in all time domains relevant to operation of the current-limiting device.

2. The method of claim 1, wherein step (c) includes plotting the peak-magnitude RMS current values versus each of the time intervals to create a profile curve.

3. The method of claim 2, further comprising the step of:
   (d) directly comparing the profile curve to an average melt curve for a current interruption device to analyze any overcurrent conditions for the current-limiting device in the system.

4. The method of claim 1, wherein the plurality of time intervals monitored in step (a) are of differing lengths that are defined by a geometric progression.

5. The method of claim 1, wherein step (a) includes the step of repeatedly storing RMS current values over a predetermined minimum time period in a FIFO (first-in-first-out) buffer.

6. The method of claim 5, wherein step (a) further includes the step of grouping the RMS current values in the FIFO buffer by a plurality of pointers, each group of RMS current values being associated with one of the time intervals.

7. The method of claim 5, wherein each of the plurality of time intervals monitored in step (a) is of a length equal to an integer multiple of the predetermined minimum time period.

8. The method of claim 1, wherein step (a) includes the step of simultaneously monitoring RMS current in a plurality of current-carrying conductors.

9. The method of claim 8, wherein step (c) includes the step of producing separate profile curves for each of the plurality of current-carrying conductors monitored in step (a).

10. The method of claim 1, wherein step (a) includes the step of monitoring RMS current over a plurality of overlapping time intervals.

11. An apparatus for analyzing potential overcurrent conditions for current-limiting devices in an electrical distribution system, the apparatus comprising:

monitoring means for simultaneously monitoring an RMS current value of a load current in the system over a plurality of time intervals, at least two of the time intervals being of different lengths; and processing means for determining a peak-magnitude RMS current value for each time interval and developing a system current profile using the peak-magnitude RMS current value for each time interval, the system current profile showing multiple, actual values of RMS current over the plurality of time intervals, the system current profile being comparative to a curve reflective of the potential overcurrent conditions for the current-limiting device in the system.

12. The apparatus of claim 11, wherein the processing means includes plotting means for plotting the peak-magnitude RMS current values versus each of the time intervals, such that the system current profile can be compared to an average melt curve of the current-limiting device.

13. The apparatus of claim 11, wherein the processing means includes:

buffer means for storing the RMS current values for each of a common time interval; and pointer means for defining differing length sets of the RMS current values stored in the buffer means such that each time interval is associated with a set of a different length.

14. A current profiling apparatus for plotting peak RMS current in an electrical distribution system over multiple different-length time intervals, the apparatus comprising:

a monitor coupled with the electrical distribution system to simultaneously monitor current flowing in the electrical distribution system over a plurality of different-length time intervals;

a processing unit coupled with the monitor to output peak-magnitude current values in the electrical distribution system for each of the plurality of time intervals; and an output device coupled with the processing unit to generate a current profile showing actual peak-magnitude current values for the plurality of time intervals.

15. The current profiling apparatus of claim 14, wherein the output device comprises a plotter that generates a plot of the peak-magnitude current values versus the plurality of time intervals.

16. The current profiling apparatus of claim 15, wherein the plotter comprises a graphics display device.

17. The current profiling apparatus of claim 14, wherein the monitor comprises at least one transformer-type current probe coupled with an RMS current value computation device.

18. The current profiling apparatus of claim 14, wherein the processing unit includes a plurality of maximum value registers for storing values corresponding to or equal to the peak-magnitude current values.

19. A method of analyzing load currents in an electrical distribution system to anticipate potential overcurrent conditions for a current-limiting device in the system, the method comprising the steps of:

(a) monitoring an RMS current value of a load current in the system over a plurality of time intervals, at least two of the time intervals being of different lengths;

(b) determining a peak-magnitude RMS current value for each time interval;

(c) developing a system current profile using the peak-magnitude RMS current value for each time interval, the system current profile being comparative to a curve reflective of the potential overcurrent conditions for the current-limiting device in the system, including plotting the peak-magnitude RMS current values versus each of the time intervals to create a profile curve; and (d) directly comparing the profile curve to an average melt curve for a current interruption device to analyze any overcurrent conditions for the current-limiting device in the system.

* * * * *